US006255160B1

United States Patent
Huang (10) Patent No.: US 6,255,160 B1
(45) Date of Patent: Jul. 3, 2001

(54) CELL DESIGN AND PROCESS FOR MAKING DYNAMIC RANDOM ACCESS MEMORY (DRAM) HAVING ONE OR MORE GIGABITS OF MEMORY CELLS

(75) Inventor: Jenn Ming Huang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/429,671

(22) Filed: Oct. 29, 1999

(51) Int. Cl.$^7$ .............................................. H01L 21/8242
(52) U.S. Cl. .................... 438/253; 438/238; 438/239; 438/241; 438/258; 438/396
(58) Field of Search .................... 438/238, 239, 438/241, 253, 258, 396

(56) References Cited

U.S. PATENT DOCUMENTS

| 5,783,462 | 7/1998 | Huang | 438/17 |
| 5,837,577 | 11/1998 | Cherng | 438/253 |
| 5,858,865 | * 1/1999 | Juengling et al. | 438/585 |
| 5,864,181 | 1/1999 | Keeth | 257/776 |
| 5,977,583 | * 11/1999 | Hosotani et al. | 257/311 |
| 6,037,216 | * 3/2000 | Liu et al. | 438/253 |
| 6,174,767 | * 1/2001 | Chi | 438/253 |

* cited by examiner

Primary Examiner—John F. Niebling
Assistant Examiner—Jennifer M. Kennedy
(74) Attorney, Agent, or Firm—George O. Saile; Stephen B. Ackerman (57) ABSTRACT

A method and novel DRAM cell design are described for making DRAM devices with more than a Gigabit memory cells. After forming the FETs and polycide word lines with a cap oxide and sidewall spacers, a thin diffusion protection oxide is deposited and openings are formed for contacts to the substrate. A conductively doped first polysilicon layer is deposited and polished back to the cap oxide. The first polysilicon remaining in the recesses between word lines is patterned to form first plug that are auto self-aligned (zero alignment error) to the word lines to achieve a very high density (Gigabit) memory. A planar first insulating layer with openings for bit lines is formed. Polycide bit lines are formed having a Si3N4 cap layer and sidewall spacers. Contact openings are selectively etched in the first insulating layer to first plugs and self-aligned to the bit lines. A doped second polysilicon layer is deposited and polished back to the Si3N4 cap layer, and the remaining polysilicon between bit lines is patterned to form auto self-aligned capacitor node-contacts to further increase memory cell density. A second insulating layer is deposited, in which DRAM capacitors are formed to complete the high density of memory for Gigabit DRAM devices. The auto self-aligned process eliminates critical photomask alignment and etching.

26 Claims, 8 Drawing Sheets

CELL DESIGN AND PROCESS FOR MAKING DYNAMIC RANDOM ACCESS MEMORY (DRAM) HAVING ONE OR MORE GIGABITS OF MEMORY CELLS

BACKGROUND OF THE INVENTION (1) Field of the Invention

This invention relates to integrated circuit semiconductor devices, and more particularly to a method for fabricating dynamic random access memory (DRAM) devices having one or more Gigabits of memory cells. This novel method improves the memory-cell density using auto self-aligning techniques while reducing electrical shorts between the word lines and polysilicon plug contacts. The method also reduces capacitor node leakage currents, and parasitic capacitance. Also reduced are the electrical shorts between the closely spaced polysilicon plugs via keyholes (voids) in the interpolysilicon oxide (IPO) due to poor gap filling with the IPO.

(2) Description of the Prior Art

Figure 1A:
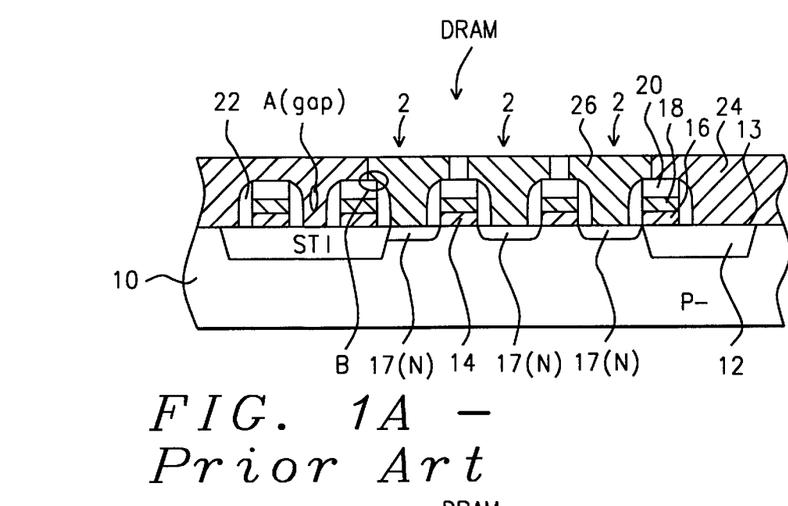
FIG. 1A shows a prior-art schematic cross-sectional view of a partially completed DRAM depicting the short-comings of the conventional technology.
Figure 1B:
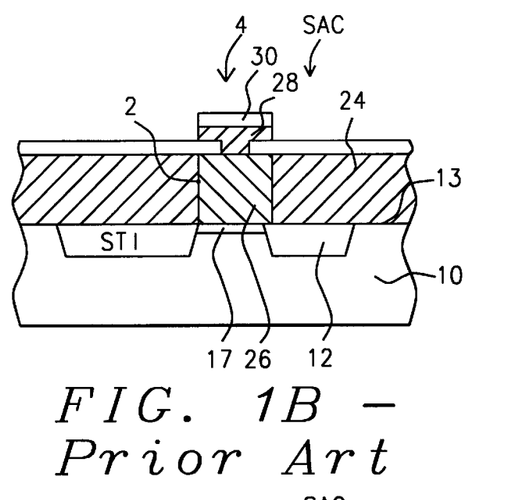
FIG. 1B shows a prior-art schematic cross-sectional view for a borderless self-aligned contact made concurrently that also depicts the shortcomings of the conventional technology.

As integrated circuit density increases, it becomes increasing difficult to manufacture ultra large scale integrated (ULSI) circuits because of process limitations. This problem is particularly acute for making future DRAM devices having more than a Gigabit of memory cells. These process limitations are best understood by referring to the conventional DRAM structure in the prior art FIGS. 1A and 1B. FIG. 1A shows a portion of a partially completed DRAM cell. Typically a shallow trench isolation (STI) 12 is formed in a silicon substrate 10 surrounding and electrically isolating device (memory cell) areas. A barrier layer 13, such as silicon nitride ($Si_3N_4$), is deposited and patterned to form openings over the device areas and a gate oxide 14 is grown on the substrate 10 for field effect transistors (FETs). A doped polysilicon layer 16, a refractory metal silicide layer 18 and an insulating cap layer 20 are deposited and patterned to form word lines (layers 16, 18) over the STI 12 while concurrently forming FET gate electrodes over the thin gate oxide 14. Doped source/drain areas 17(N) are formed adjacent to the gate electrodes by ion implantation and a conformal insulating layer is deposited and anisotropically plasma etched back to form sidewall spacers 22 on the sidewalls of the FET gate electrodes (patterned layers 16 and 18). Next an insulating layer 24 is deposited and polished back to form the first interpolysilicon oxide layer (IPO-1) and a photoresist mask and plasma etching are used to etch contact openings that extend over the FET gate electrodes (self-aligned) and down to the source/drain areas. One problem encountered in this conventional self-align process is damage to the source/drain areas 17 when the contact holes are plasma etched. Another problem is the overetching of the cap oxide layer 20, as depicted at point B in FIG. 1A, which can result in shorts to the FET gate electrodes when the contact holes are filled with a doped polysilicon 26 (poly plugs) to make electrical contacts. Also the poly plugs also overlap the gate electrodes resulting in increased parasitic capacitance, resulting in an increased RC time constants and reduced circuit speed. Another problem encountered is poor gap filling between the closely spaced word lines (patterned layers 16, 18 & 20) having high aspect ratios, as depicted at point A in FIG. 1A. When closely spaced contact openings 2 are etched in the insulating layer 24 and into the voids A between the word lines shorts can occur when the contact holes 2 are filled with polysilicon 26 to form the poly plugs. A major shortcoming of the conventional process is the need to align the contact hole extending over the FET gate electrodes, and requires relaxing the alignment rules which makes it difficult to achieve the required density for Gigabit DRAM chips. Still another problem with the conventional process is depicted in FIG. 1B for concurrently making borderless contacts 4 to the silicon substrate, that is, contacts that extend over the shallow trench isolation (STI). When contact openings 2 are etched in the insulating layer 24, it is necessary to use an etch stop layer 13 ($Si_3N_4$) to prevent over etching the STI at the edge and damaging the contact. However, this requires additional process steps.

Numerous methods of making DRAM devices with improved electrical characteristics while increasing memory cell density have been reported. One method is described by Huang in U.S. Pat. No. 5,783,462 in which external contacts for testing stacked capacitor DRAM, but does not address the above problem. Another method for making DRAM devices with increased density and improved sign-to-noise ratio is described by Keeth in U.S. Pat. No. 5,864,181 but also does not address the above concerns. Cherng in U.S. Pat. No. 5,837,577 teaches a method for making DRAM capacitor node contacts self-aligned to. the bit lines but also does not address the above problems.

However, there is still a need in the industry to provide an improved process with novel cell design that is applicable to DRAMs having more than a Gigabit of memory cells. Further while reducing the narrow spacings for Gigabit DRAMS by minimizing the alignment tolerance ground rule, it is also necessary to reduce parasitic capacitance, capacitor node leakage currents, and electrical shorts between closely spaced polysilicon plug contacts to achieve an acceptable circuit performance and an acceptable product yield.

SUMMARY OF THE INVENTION

A principal object of the present invention is to form capacitor-over-bit line (COB) dynamic random access memory (DRAM) devices with increased memory cell density for future DRAM devices with one or more Gigabits of memory cells. The increase in cell density is achieved by using a double auto self-aligned polysilicon contact plugs technique.

A second objective of this invention is to form these high-density memory cells with reduced electrical shorts, reduced parasitic capacitance to word lines and reduced capacitor node leakage current by reducing plasma etch damage at the substrate contacts.

A third objective of this invention is to form the interpolysilicon oxide (IPO) gap filling after the auto-self-aligned polysilicon plugs are formed. This prevents the polysilicon plugs from shorting through keyhole channels (voids) in the IPO while the keyhole cavities between plugs further reduce intralevel capacitance.

Still another objective of this invention is to provide a very cost-effective manufacturing process.

This novel invention is a method for making DRAM devices with one or more Gigabits of memory cell. The method begins by providing a semiconductor substrate, such as a $P^-$ doped single-crystal silicon having a <100> crystallographic orientation. A relatively thick Field OXide (FOX) is formed that surrounds and electrically isolates device areas on the substrate for the DRAM memory cells. One conventional method of forming the field oxide areas is by a shallow trench isolation (STI) method, as commonly practiced in the industry. Field effect transistors (FETS) are formed next by growing a thin gate oxide on the device areas. A first polycide layer is formed by depositing a heavily N⁺ doped polysilicon layer and a refractory metal silicide layer. An insulating layer, such as silicon oxide ($SiO_2$), is deposited to form a first cap layer on the polycide layer. The cap layer and first polycide layer are patterned to form the DRAM word lines that also serve as gate electrodes over the device areas. Next N doped source/drain areas are formed adjacent to the gate electrodes and a conformal insulating layer is deposited and anisotropically etched back to form first sidewall spacers on the gate electrodes.

Next a thin conformal diffusion protection oxide layer, such as $SiO_2$, is deposited and is patterned to form openings where contacts to the substrate are desired. Then a first conducting layer, preferably composed of an N doped polysilicon is deposited and is chemically-mechanically polished (CMP) back to the first cap oxide layer. A photoresist mask and plasma etching are used to pattern the polished back first conducting layer to form the first contact plugs for bit lines and for capacitor node contacts. The polish-back results in the first contact plugs being auto-self-aligned to the gate electrodes. This eliminates the critical alignment requirement for etching the self-aligning contact openings 2 in the conventional process (see FIG. 1A) and avoids the damage due to plasma etching in the contact opening. Also the damage to borderless contacts 4 (see prior art FIG. 1B) is also avoided. Next a first insulating layer, preferably $SiO_2$, is deposited and planarized by CMP. Because the first insulating layer is deposited after the polysilicon plugs are formed, the gaps (voids) formed are not continuously open between the closely spaced plugs. This avoids the electrical shorts, of the conventional process when contact openings are etched in the insulating layer having the keyhole gaps. Bit-line contact openings are etched in the first insulating layer to the first contact plugs for the bit lines. A second polycide layer and a second cap layer, composed of silicon nitride ($Si_3N_4$), are deposited and patterned to form the bit lines. A conformal $Si_3N_4$ or silicon oxynitride (SiON) layer is deposited and anisotropically etched back to form second sidewall spacers on the bit lines. Capacitor node contact openings are selectively etched in the first insulating layer to the first contact plugs for forming capacitor node contacts while the $Si_3N_4$ cap layer and the second sidewall spacers (SiON) protect the bit lines during etching. A second conducting layer, preferably composed of an N-doped polysilicon, is deposited and polished back to the $Si_3N_4$ second cap layer. The polished back polysilicon layer is then patterned using a photoresist mask and plasma etching to form second contact plugs for capacitor node contacts to the first contact plugs. This second polish back results in a second auto self-aligned contact that eliminates another critical photoresist mask alignment a further increases circuit density. The method for making this high-density array of DRAM cells is now completed by forming a planar second insulating layer, such as $SiO_2$. Openings are etched in the second insulating layer over and to the second contact plugs for capacitor bottom electrodes. A conformal third conducting layer is formed in the openings for the capacitor bottom electrodes and a thin interelectrode dielectric layer and a fourth conducting layer are formed over the capacitor bottom electrodes to form the capacitors and to complete the high-density array of memory cells for Gigabit DRAM devices.

The invention also includes a method of integrating into the DRAM process an improved borderless self-aligned contact (SAC). This improved SAC does not need a silicon nitride hard mask to protect the edge of the shallow trench isolation (STI), as in the conventional process when contact openings are etched in a thick interpolysilicon oxide (IPO) layer to the silicon substrate.

BRIEF DESCRIPTION OF THE DRAWINGS

The objects and advantages of this invention are best understood with reference to the attached drawings in the figures and the embodiment that follows.

DESCRIPTION OF THE PREFERRED EMBODIMENT

The invention is now described in detail for making this array of high-density memory cells for DRAMs having more than a gigabit of memory cells, and for concurrently making improved borderless self-aligned contacts for DRAM devices on a silicon substrate. The series of cross sectional views in the left portions of FIGS. 2–9 are for making the DRAM cells and are likewise labeled "DRAM" while the right portion of FIGS. 2–9 are for making the self-aligned contact (SAC) and are correspondingly labeled "SAC". The top views in FIGS. 3B and 4B depict only the DRAM cell design with the auto self-aligned first polysilicon contact plugs self aligned to the word lines and contacting the substrate. The top views in FIGS. 7B and 8B depict the auto self-aligned second polysilicon plugs to the bit line for completing the capacitor node contact to the underlying first polysilicon plugs.

Although the process is described for making memory cells for DRAM devices having N-channel FETs as the access transistors on a P-doped substrate, it should also be well understood by one skilled in the art that by including additional process steps, in addition to those described in this embodiment, other types of devices can be included on the DRAM chip. For example, by forming N-well regions in a P-doped substrate, P-channel FETs can also be provided and Complementary Metal-Oxide-Semiconductor (CMOS) circuits can be formed therefrom, such as are required for the peripheral circuits on the DRAM chip and embedded DRAM circuits. Although the method is described in detail for making auto self-aligned polysilicon plugs, it should also be understood that other electrically conducting materials, such as tungsten or tungsten silicide and the like, can be used to form the plugs when process compatible Referring now to FIG. 2, the method begins by providing a semiconductor substrate 10, a portion of which is shown in the Fig. for a partially completed DRAM cell. On the left is the DRAM cell and on the right is the borderless SAC. Typically the substrate is a P⁻ doped single-crystal silicon having a <100> crystallographic orientation. Field OXide (FOX) regions 12 are formed surrounding and electrically isolating the device areas. One conventional method of forming the field oxide regions is by using a shallow trench isolation (STI) method, as commonly practiced in the industry. Generally the STI is formed by etching trenches in the field oxide regions on the substrate 10 to a depth of between about 2500 and 5000 Angstroms. After forming a thin thermal oxide (not shown) in the trenches, the trenches are filled with an insulating material such a chemical vapor deposited $SiO_2$, and are made planar with the surface of the substrate 10, for example, by using a planarizing plasma etchback or chemical/mechanical polishing (CMP) to form the STI 12. Next, a thin gate oxide 14 of about 15 to 70 Angstroms thick is grown on the device areas.

Figure 2:
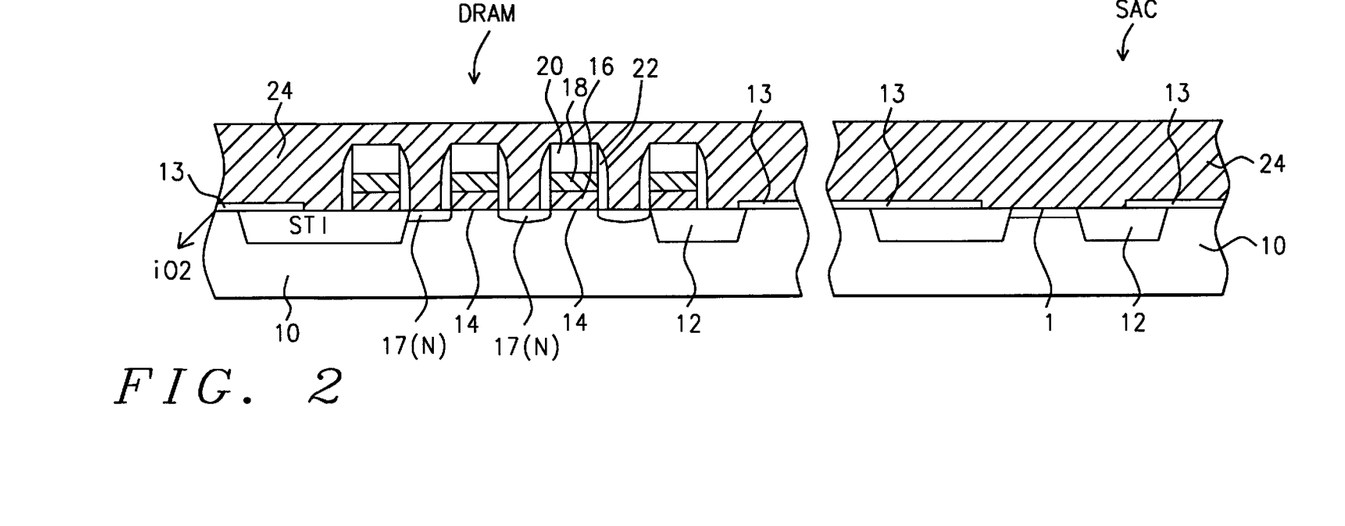
FIGS. 2 through 9 show a series of schematic cross-sectional views with schematic top views depicting the sequence of process steps for making the high-density array of memory cells for a DRAM using an auto-self-aligned contact method and the method for concurrently making a borderless SAC.

Still referring to FIG. 2, a first polycide layer is formed by depositing a heavily $N^+$ doped polysilicon layer 16 and a refractory metal silicide layer 18. The polysilicon layer 16 is deposited by chemical vapor deposition (CVD) using silane ($SiH_4$) as the reactant gas and is deposited to a preferred thickness of between about 500 and 2000 Angstroms. The polysilicon layer 16 is doped with arsenic (As) or phosphorus (P) by ion implantation after deposition or is doped during the CVD polysilicon deposition by adding a dopant gas, such as arsine ($AsH_3$) or phosphine ($PH_3$). Layer 16 is preferable doped to a concentration of between about 1.0 E 20 and 1.0 E 22 atoms/$cm^3$. The silicide layer 18 is preferably a tungsten silicide ($WSi_x$) and is also deposited by CVD using tungsten hexafluoride ($WF_6$) and $SiH_4$ as the reactant gases and is deposited to a preferred thickness of between about 500 and 1500 Angstroms. An insulating layer 20, such as silicon oxide ($SiO_2$), is deposited to form a first cap layer 20 on the polycide layer (16 and 18). The cap layer 20 is deposited by low pressure CVD (LPCVD) using, for example tetraethosiloxane (TEOS) as the reactant gas, and is deposited to form a relatively thick layer. For example the $SiO_2$ layer 20 is deposited to a thickness of between about 1000 and 2000 Angstroms. The cap layer 20 and first polycide layer (layers 16 and 18) are then patterned using conventional photolithographic techniques and anisotropic plasma etching to form the DRAM word lines that also serve as gate electrodes over the device areas. Next N doped source/drain areas 17(N) are formed adjacent to the gate electrodes, for example by ion implanting $As^{75}$ or $p_{31}$ ions. Preferably ions are implanted at a dose and energy to achieve a final concentration of between about 1.0 E 17 and 1.0 E 18 atoms/$cm^3$. First sidewall spacers 22 are formed on the sidewalls of the gate electrodes (patterned layers 20, 18 and 16) by depositing a conformal insulating layer 22 which is then anisotropically etched back. The conformal layer 22 is preferably $SiO_2$ and is deposited by LPCVD using TEOS as the reactant gas. The layer 22 is then anisotropically etched back using reactive ion etching (RIE) or a high density plasma (HDP) etching to achieve a sidewall spacer width of between about 500 and 1000 Angstroms. Next, as shown in FIG. 2, a relatively thin conformal diffusion protection oxide layer 13 is deposited. Layer 13 is preferably $SiO_2$ and is deposited by LPCVD using TEOS as the reactant gas and is deposited to a thickness of between about 100 and 500 Angstroms. Layer 13 is then patterned to form openings where contacts to the substrate are desired, such as for the self-aligned contacts (SAC) 1 (right portion of FIG. 2) and over the DRAM cells, as shown in the left portion of FIG. 2. The patterning of layer 13 is carried out using a patterned photoresist mask (not shown) and wet etching in a dilute solution of hydrofluoric acid (HF) and water ($H_2O$) to provide essentially damage free contacts on the substrate surface. Typically a solution of HF to $H_2O$ of between about 1:100 and 5:100 by volume is used to etch layer 13.

Still referring to FIG. 2, a first conducting layer 24 is deposited. Layer 24 is preferably composed of an N conductively doped polysilicon and is deposited by low pressure chemical vapor deposition (LPCVD) using silane ($SiH_4$) as the reactant gas. Layer 24 is doped in situ by adding a dopant gas such as arsine ($ASH_3$) or phosphine ($PH_3$) during the polysilicon deposition. The layer 24 is preferably doped to a concentration of between about 1.0 E 20 and 1.0 E 22 atoms/$cm_3$. The polysilicon layer 24 is deposited to a thickness sufficient to fill the recesses between the word lines, but more specifically to a thickness of between about 4000 and 7000 Angstroms.

Figure 3A:
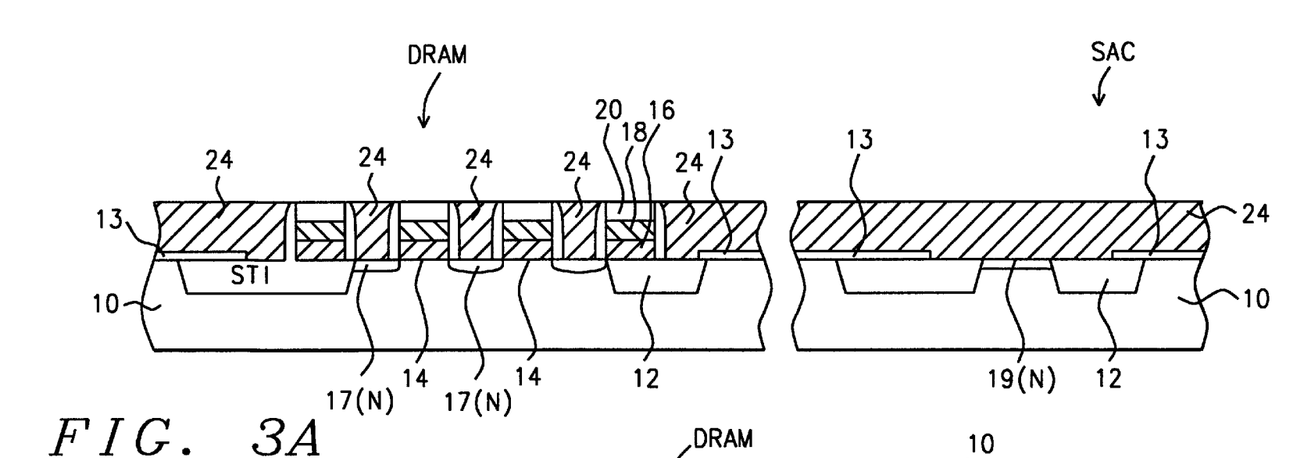
Figure 3B:
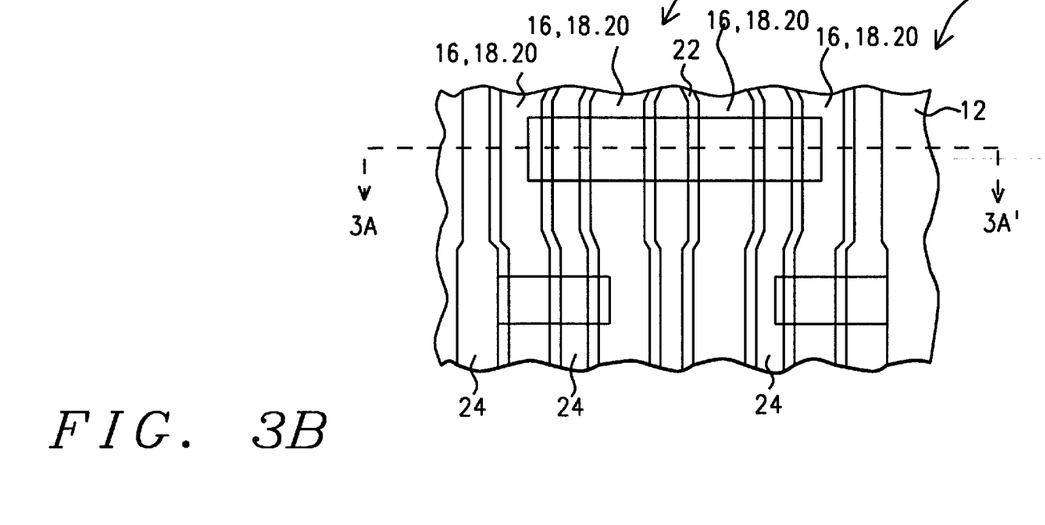

Referring next to FIG. 3A, the polysilicon layer 24 is planarized back to the cap layer 20. For example, layer 20 is chemically-mechanically polished (CMP) using commercially available polishing tools. This CMP results in the remaining N doped polysilicon layer 24 between the word lines being automatically aligned to the gate electrodes (patterned layers 16, 18 and 20). This auto self-alignment eliminates the critical alignment requirement for etching the self-aligning contact openings 2 in the conventional process (see FIG. 1A) and avoids the damage due to plasma etching in the contact opening. To better appreciate this process step, a top view after the CMP is depicted in FIG. 3B in which the cross section in FIG. 3A is through 3A–3A' of FIG. 3B. The Chem-mech polished backe polysilicon layer 24 is self-aligned to the sidewall spacers 22 on the gate electrodes (16, 18 and 20). The top view is only depicted for the DRAM portion of FIG. 3A. Since there is no critical alignment and etch step, as in the conventional process (see FIG. 1A), the circuit density is significantly increased as required for Gigabit DRAM devices. Also since the N doped polysilicon 24 is deposited prior to depositing the ILD layer and etching contact holes, as in the conventional process of FIG. 1, the method avoids plasma etch damage to the source/drain areas 17(N) in the DRAM cell areas and to borderless contact areas 19(N) as depicted in SAC portion of FIG. 3A.

Figure 4A:
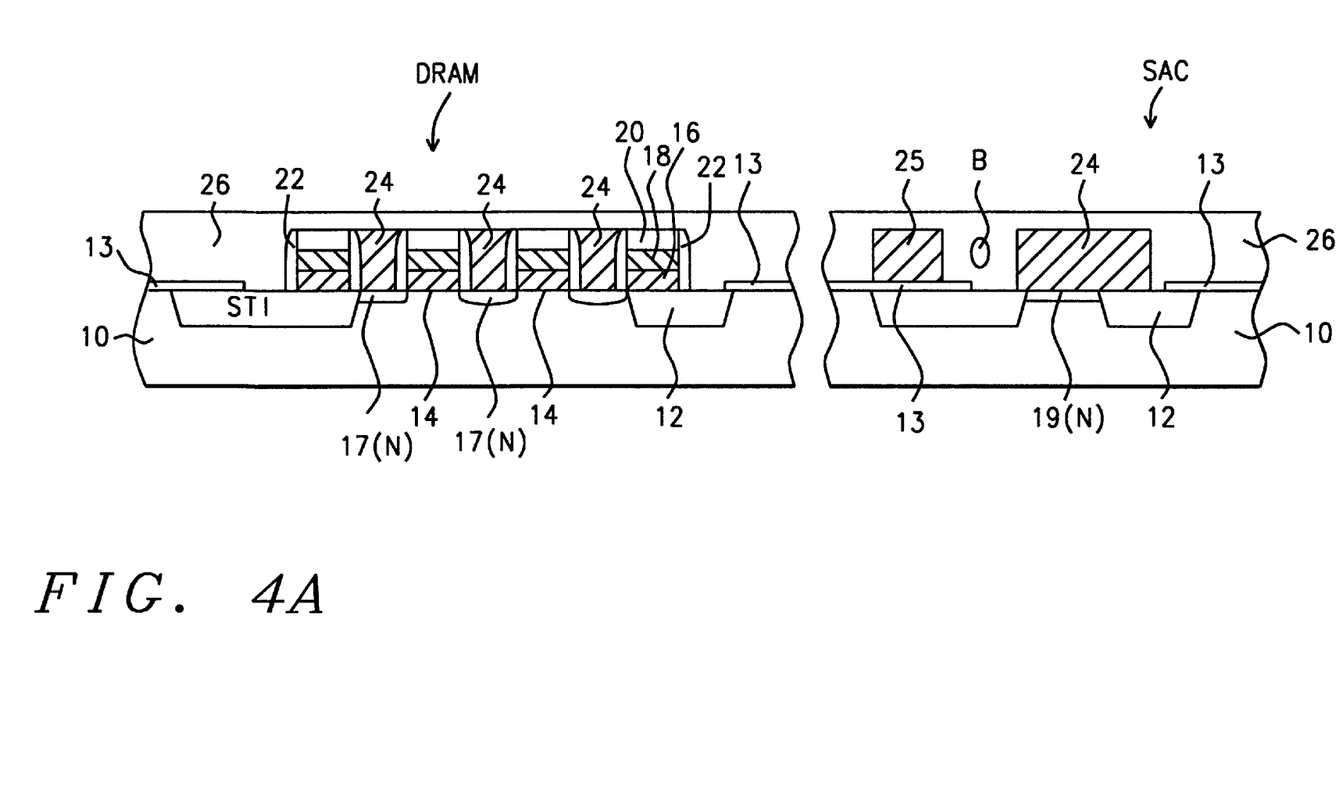
Figure 4B:
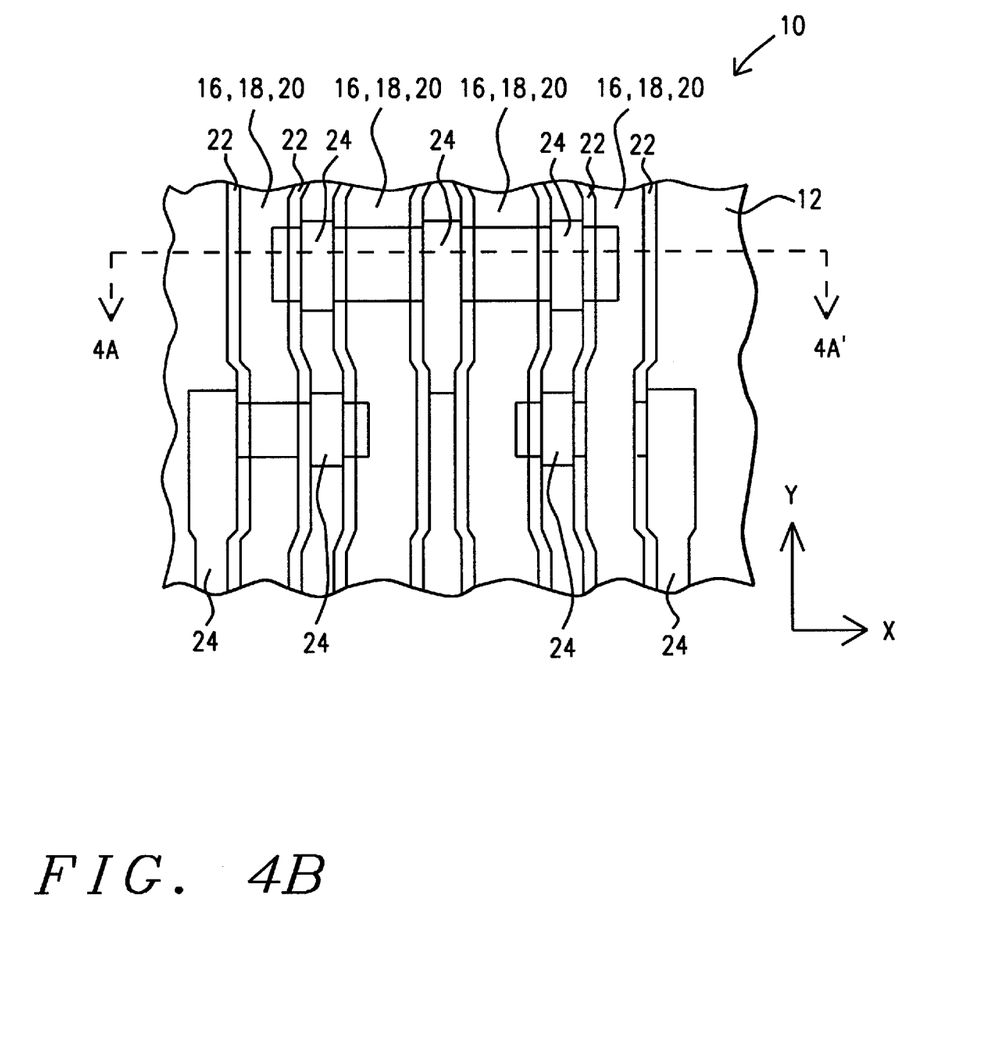

Referring now to FIG. 4A, a non-critical (alignment) photoresist masking step and plasma etching are used to pattern the remaining polysilicon layer 24 to complete the first polysilicon contact plugs 24 for both the bit lines and capacitor node contacts. The N doped polysilicon layer 24 is also patterned, at the same time, to form the borderless self-aligned contacts 24 to the substrate contacts 19(N) and to form interconnections 25, as depicted in the right portion (SAC) of FIG. 4A. The plasma etching is carried out preferably in a high density plasma (HDP) etcher using an etchant gas mixture containing chlorine ($Cl_2$) and hydrogen bromide (HBr).

A top view of the DRAM cell after the process step carried out in FIG. 4A is depicted in FIG. 4B. The borderless contact (SAC) portion of FIG. 4A is not depicted in the top view. The cross section for the DRAM in FIG. 4A is shown for the region through 4A–4A' of the top view in FIG. 4B. The photoresist mask is not shown, but the alignment of the mask is non-critical in both the x and y directions for etching the plugs 24 depicted in FIG. 4B. Since the patterned photoresist mask can overlap the cap insulating layer 20 an isotropic plasma etch can be used to effectively remove the polysilicon layer 24 in the recesses between the word lines (16, 18, 20). Further, since the plugs do not extend over the word lines the parasitic capacitance between the plug 24 and the word line is reduced.

Still referring to FIG. 4A, a first insulating layer 26 is deposited and planarized. The insulating layer 26 is preferably $SiO_2$ or a doped oxide such as borophososilicate glass (BPSG). The $SiO_2$ is deposited by LPCVD using a reactant gas such as TEOS and the BPSG can be formed by adding a dopant gas during deposition. The insulating layer 26, commonly referred to in the industry as the first interpolysilicon oxide (IPO-1) layer, is preferably planarized by CMP. Because the first insulating layer is deposited after the polysilicon plugs 24 are formed, the air gaps (or voids) formed are not continuously open between the closely spaced plugs 24. This avoids the electrical shorts, of the conventional process where contact openings 2 are etched in the insulating layer 24 having the keyhole gaps due to poor gap filling, as depicted in the prior art of FIG. 1A. Since the closed voids (point B in FIG. 4A) have an effective relative dielectric k equal to about 1.0, the intralevel parasitic capacitance is also further reduced.

Figure 5:
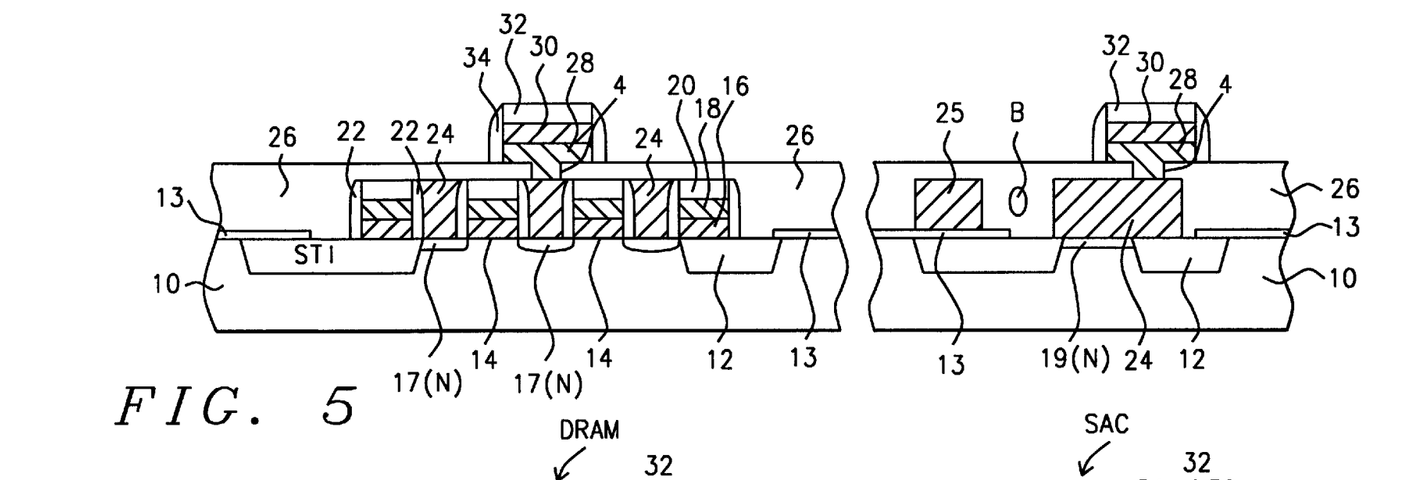

Referring now to FIG. 5, conventional photolithographic techniques and anisotropic plasma etching are used to etch contact openings 4 in the first insulating layer 26 to first contact plugs 24 for bit line contacts while the first contact plugs 24 for node contact are protected with photoresist (not shown). After stripping the photoresist a second polycide layer composed of a N doped polysilicon layer 28, a refractory metal silicide layer 30 and a second cap insulating layer 32 is deposited and patterned to form the bit lines. The process for forming the bit lines is similar to the process for forming the word lines and is therefore not discussed in detail. However, the preferred thickness of the polysilicon layer 28 is between about 500 and 1000 Angstroms, the thickness of the tungsten silicide layer 30 is between about 500 and 1500 Angstroms, and the thickness of the cap layer 32 is between about 1000 and 2000 Angstroms. However, the second insulating cap layer 32 and the sidewall spacers 34 for the bit lines are preferably composed of silicon nitride ($Si_3N_4$) and/or silicon oxynitride (SiON). For example the $Si_3N_4$ can be deposited by LPCVD using silane and ammonia ($NH_3$) as the deposition gases, and the SiON can be deposited by adding nitrous oxide ($N_2O$) during LPCVD.

Figure 6:
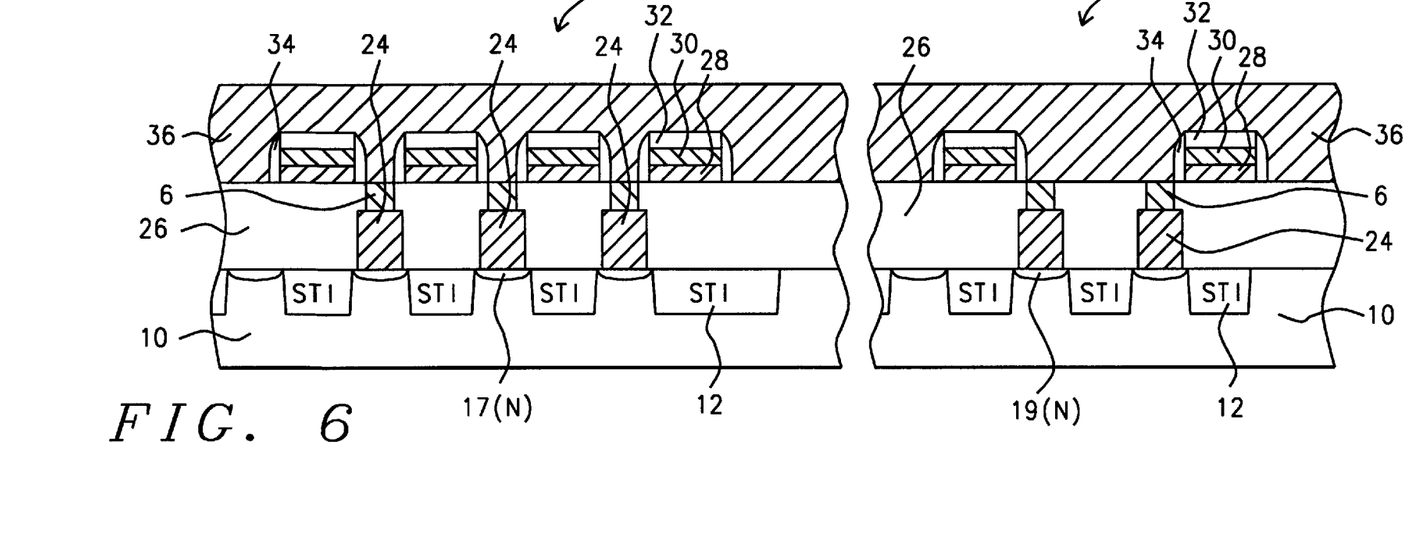

Referring now to FIG. 6, the method of making auto self-aligned second contact plugs for capacitor node contacts that are auto self-aligned to the bit lines is now described. Since the bit lines are typically formed orthogonal to the word lines on the actual product the cross sectional views in FIGS. 6 through 9 are cross section that are normal to the cross sections in the earlier FIGS. 2–5, and therefore, the FET gate electrodes are not in view. Referring first to the DRAM portion of FIG. 6, openings 6 are selectively etched in the first insulating layer 26 to the first contact plugs 24 for forming capacitor node contacts. Concurrently, contact openings (also labeled 6) for the borderless contacts 19(N) are etched in layer 26 to the polysilicon plugs 24, as depicted in the SAC portion of FIG. 6. The openings in the photoresist mask (not shown) used for making these contact openings 6 extend over the $Si_3N_4$ cap layer 32 and therefore the openings 6 in layer 26 are self-aligned to the bit lines. Typically the contact openings 6 are etched using HDP etching or reactive ion etching and an etchant gas mixture which selectively etches the $SiO_2$ to the $Si_3N_4$ cap layer. For example, one preferred etch gas mixture is a fluorine based gas and oxygen ($O_2$) which has an etch rate selectivity of $SiO_2$ to $Si_3N_4$ of about 5:1.

Still referring to FIG. 6, a second conducting layer 36, preferably composed of an N-doped polysilicon, is deposited by LPCVD using silane as the reactant gas and is in situ doped with an N type conductive dopant. For example layer 36 can be doped with phosphorus (P), by adding a dopant gas, such as phosphine ($PH_3$) during the deposition. Polysilicon layer 36 is doped to a preferred concentration of between about 1.0 E 20 and 1.0 E 22 atoms/$cm^3$ and is deposited to a thickness sufficient to fill the recesses between the bit lines (patterned layers 28, 30 and 32). More specifically layer 36 is deposited to a thickness of between about 4000 and 7000 Angstroms.

Figure 7A:
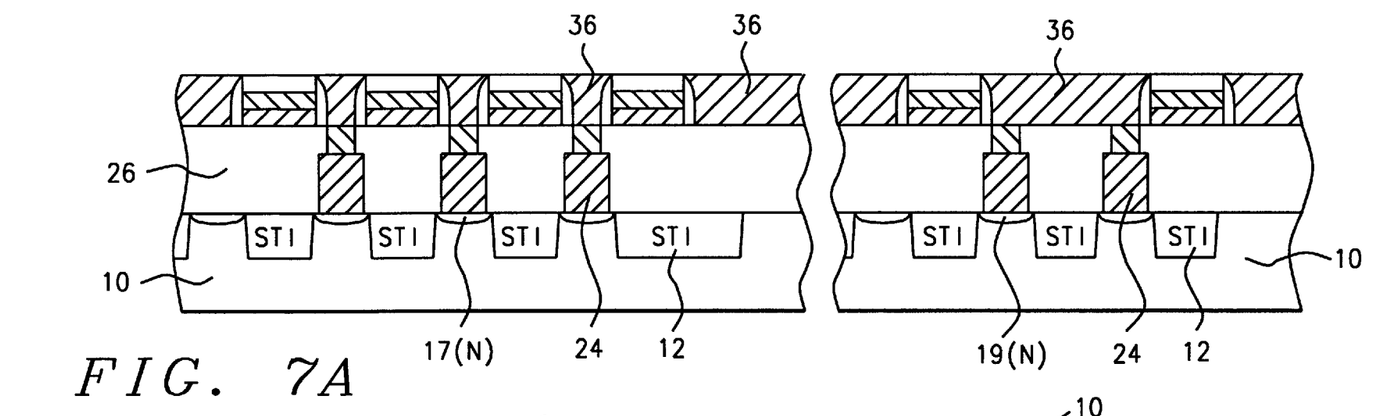
Figure 7B:
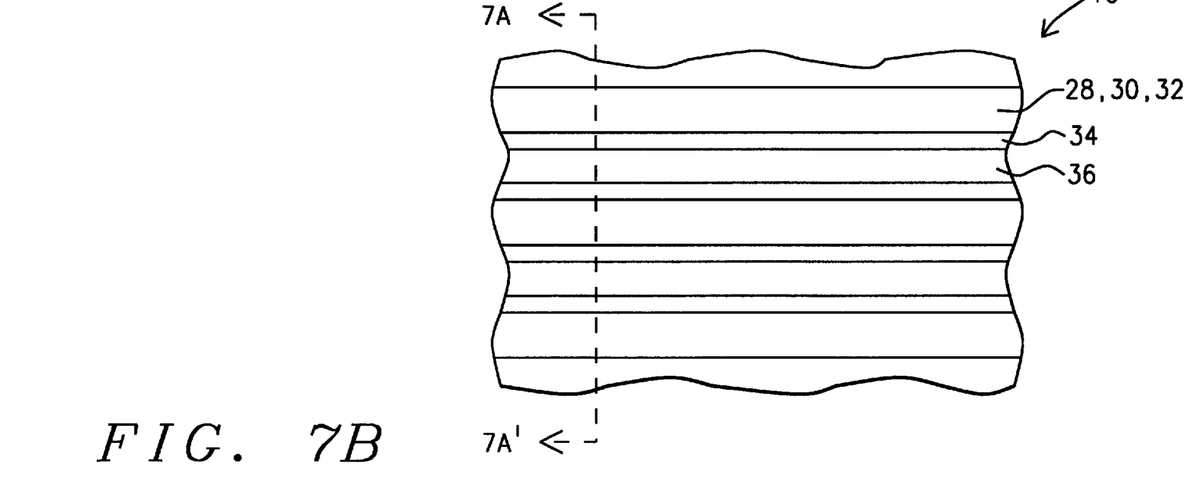

Now as shown in FIG. 7A, the polysilicon layer 36 is chemically-mechanically polished back to the $Si_3N_4$ second cap layer 32. This second polish back results in a second auto self-aligned contact, also labeled 36, that eliminates another critical photoresist mask alignment and further increases the circuit density for Gigabit DRAM devices. The method forms the capacitor node contacts for the DRAM cells while concurrently forming the auto self-aligned contacts 36 to the first polysilicon plugs 24 for the borderless contact 19(N), as depicted in the SAC portion of FIG. 7A. To better appreciate this improved structure a top view of the DRAM cell area is shown in FIG. 7B with the cross section in FIG. 7A through the region 7A–7A' in FIG. 7B. The top view depicts the polished back polysilicon layer 36 auto self-aligned to the $Si_3N_4$ or SiON sidewall spacers 34, and therefore self-aligned to the bit lines (patterned layers 28, 30 and 32).

Figure 8A:
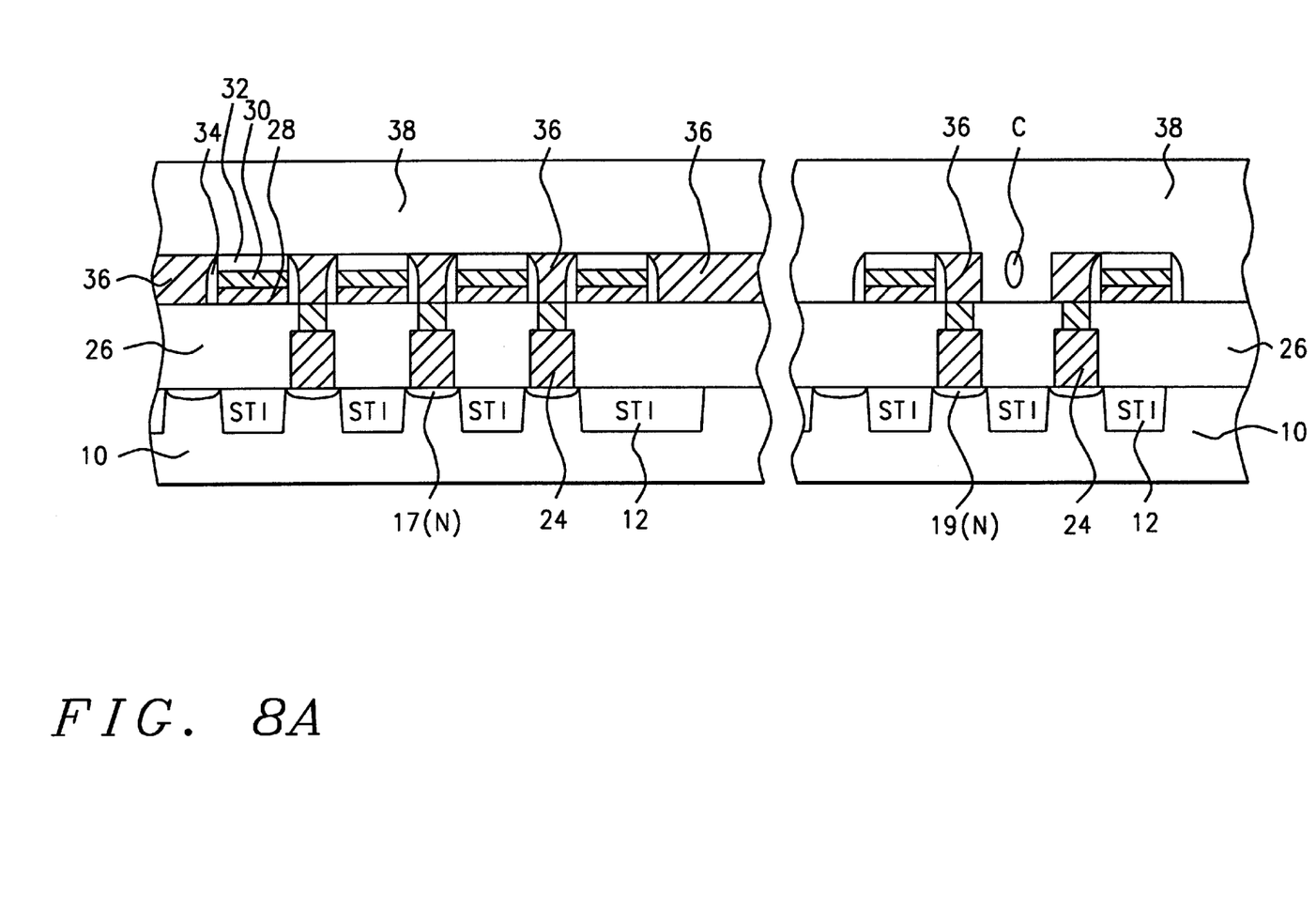
Figure 8B:
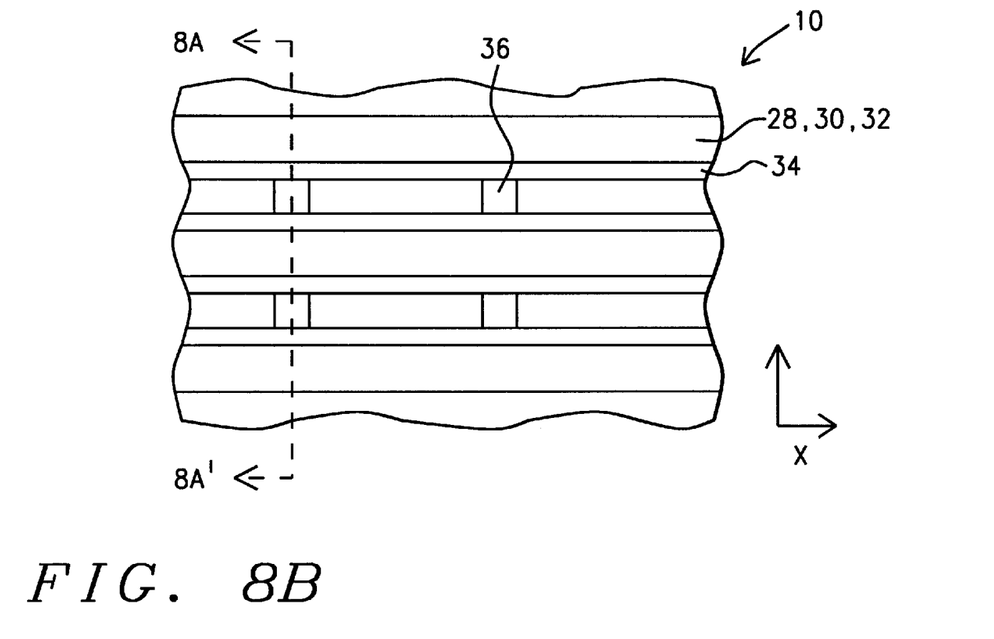

Referring now to FIG. 8A, the remaining portions of the polished back polysilicon layer 36 are then patterned using a photoresist mask and plasma etching to form second contact plugs 36 to the first contact plugs 24 for capacitor node contacts. Conventional photolithographic techniques and plasma etching are used to pattern the remaining polysilicon layer 36, similar to the process used to etch the first polysilicon plugs 24. The N doped polysilicon layer 36 is also patterned, at the same time, to complete auto self-aligned contacts for the borderless self-aligned contacts 24 to the substrate contacts 19(N), as depicted in the right portion (SAC) of FIG. 8A. The polysilicon layer 36 remaining in the recesses between the bit lines after CMP is patterned using selective etching in a high density plasma (RDP) etcher that etches polysilicon selectively to the $Si_3N_4$ insulating cap layer 32, to the sidewall spacers 34, and to the underlying silicon oxide layer 26. The etch rate ratio of polysilicon to silicon nitride is preferably greater than about 5:1, and can be achieved using an etchant gas mixture having a $Cl_2$ base.

The photoresist mask (not shown) used to pattern the second polysilicon plugs 36 also extends over the $Si_3N_4$ insulating cap 32, therefore, the alignment of the photoresist etch mask is not critical and full advantage of the auto self-alignment is used to achieve Gigabit DRAM devices. To better appreciate this auto self-alignment a top view is shown in FIG. 8B after the patterning of the second polysilicon plugs 36. The cross section in FIG. 8A is through the region 8A–8A' in FIG. 8B. Since the second polysilicon plugs 36 are perfectly aligned to the sidewall spacers 34, and therefore aligned to the bit lines (patterned layers 28, 30 and 32) the maximum density is achieved.

Still referring to FIG. 8, a planar second insulating 38, commonly referred to as an interpolysilicon oxide 2 (IPO-2), is formed over the bit lines as an insulating layer. The preferred second insulating layer 38 is $SiO_2$ or a doped glass and is deposited by LPCVD using a reactant gas such a TEOS or TEOS and Ozone ($O_3$) to form $SiO_2$. The $SiO_2$ can be doped with boron and/or phosphorus during deposition to form a BSG or a BPSG. Insulating layer 38 is then planarized, for example by CMP to have a preferred thickness of between about 5000 and 15000 Angstroms over the bit lines. Since the second insulating layer 38 is deposited after the auto self-aligned polysilicon plugs 36 are formed, any air gaps (voids) due to poor gap fill of layer 38, such as void C depicted in the right (SAC) portion of FIG. 8A do not cause electrical shorts between the plugs 36.

Figure 9:
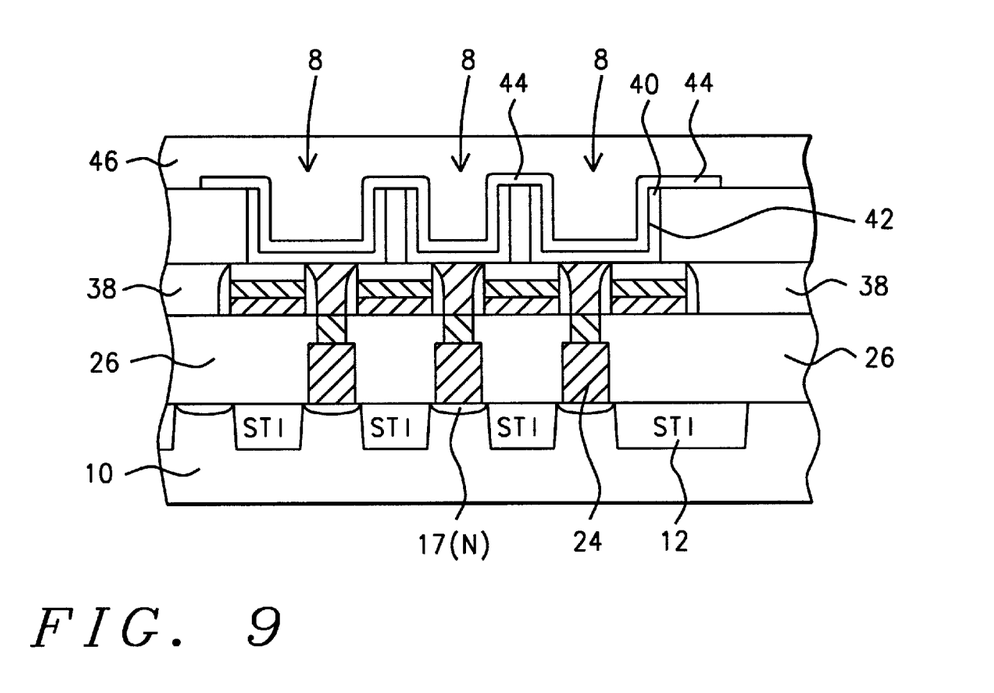

Referring now to FIG. 9, an array of DRAM stacked capacitors are formed to complete the array of memory cells. Conventional photolithographic techniques and anisotropic plasma etching are used to etch openings 8 in the second insulating layer 38 aligned over the second polysilicon plugs 36. The openings 8 are etched selectively to the polysilicon plugs 36 using reactive ion etching (RIE) and an etchant gas containing fluorine species (e.g. $CHF_3$) to achieve openings having essentially vertical sidewalls.

Next a conformal third conducting layer 40 is deposited. Layer 40 is preferably a doped polysilicon layer, deposited by LPCVD using, for example, $SiH_4$ as the reactant gas, and is doped in situ with phosphorus by adding a dopant gas such as phosphine ($PH_3$). Layer 40 is deposited to a preferred thickness of between about 500 and 1000 Angstroms, and is doped to a concentration of between about 1.0 E 20 and 1.0 E 22 atoms/cm$^3$. Layer 40 is then etched or polished back to form capacitor bottom electrodes in the openings 8 while removing completely the polysilicon layer 40 from the top surface of the insulating layer 38. Then a thin interelectrode dielectric layer 42, that has a high dielectric constant (high-k), is formed on the array of bottom electrodes 40. The dielectric layer 42 is preferably composed of layers of $SiO_2/Si_3N_4/SiO_2$ (ONO). The ONO dielectric layer can be formed by first growing a thin thermal oxide (e.g., 5 Angstroms) on the polysilicon bottom electrodes 40. A $Si_3N_4$ layer is deposited by LPCVD. Then a thin $SiO_2$ is formed using an oxidation furnace to partially reduce the $Si_3N_4$ layer to form a top $SiO_2$ layer that provides a pin-hole-free ONO layer. The effective thickness of the ONO is about 35 to 50 Angstroms. A fourth conducting layer 44 is deposited over the capacitor bottom electrodes to complete the capacitors and to form a high-density array of memory cells for Gigabit DRAM devices. Layer 44 is preferably an in-situ doped polysilicon layer and is deposited by LPCVD using a reactant gas such $SiH_4$, and using a dopant gas such as $PH_3$. The polysilicon layer 44 is doped $N^+$ to a preferred concentration of between about 1.0 E 19 and 1.0 E 22 atoms/cm$^3$. The preferred thickness of the polysilicon layer 44 is between about 500 and 1000 Angstroms. Layer 44 is then patterned to form the capacitor top electrodes. A third insulating layer 46 is deposited sufficiently thick to electrically insulate the array of capacitors on the DRAM device prior to subsequent processing to complete the DRAM device. Layer 46 is $SiO_2$, and is deposited by LPCVD.

While the invention has been particularly shown and described with reference to the preferred embodiment thereof, it will be understood by those skilled in the art that various changes in form and details may be made without departing from the spirit and scope of the invention.

What is claimed is:

1. A method for making an array of high-density memory cells having auto-self-aligned contacts for DRAM devices on a semiconductor substrate comprising the steps of:

forming device areas for memory cells surrounded and electrically isolated by field oxide areas on said substrate;

forming a gate oxide on said device areas;

depositing a first polycide layer and a first cap oxide layer and patterning to form word lines extending over said device areas to form FET gate electrodes, and forming doped source/drain areas adjacent to said gate electrodes, and forming first sidewall spacers on said word lines;

forming a patterned diffusion protection oxide with openings for contacts to said substrate;

depositing a first conducting layer;

polishing back said first conducting layer to said first cap oxide layer and patterning said first conducting layer to form first contact plugs that are auto-self-aligned to said gate electrodes;

depositing and planarizing a first insulating layer;

etching bit-line contact openings in said first insulating layer to said first contact plugs;

depositing a second polycide layer and a second cap layer and patterning to form bit lines and forming insulating second sidewall spacers on said bit lines;

etching capacitor node contact openings in said first insulating layer to said first contact plugs;

depositing a second conducting layer;

polishing back said second conducting layer to said second cap layer and patterning said second conducting layer to form second contact plugs for capacitor node contacts to said first contact plugs, said second contact plugs auto-self-aligned to said bit lines;

depositing and planarizing a second insulating layer and etching openings for capacitor bottom electrodes to said second contact plugs;

forming a third conducting layer in said openings for said capacitor bottom electrodes, and forming an interelectrode dielectric layer and a fourth conducting layer to form said capacitors and completing said array of high-density memory cells.

2. The method of claim 1, wherein said first polycide layer is composed of a doped polysilicon layer having a thickness of between about 500 and 2000 Angstroms and an upper tungsten silicide layer having a thickness of between about 500 and 1500 Angstroms.

3. The method of claim 1, wherein said first cap oxide layer is silicon oxide deposited by low-pressure chemical vapor deposition to a thickness of between about 1000 and 2000 Angstroms.

4. The method of claim 1, wherein said first sidewall spacers are silicon oxide and have a width of between about 500 and 1000 Angstroms.

5. The method of claim 1, wherein said diffusion protection layer is silicon oxide deposited by chemical vapor deposition to a thickness of between about 100 and 500 Angstroms.

6. The method of claim 1, wherein said first conducting layer is a polysilicon layer deposited by low-pressure chemical vapor deposition to a thickness sufficient to fill the recesses between said word lines, and is doped with an N type dopant to a concentration of between about 1.0 E 20 and 1.0 E 22 atoms/cm$^3$.

7. The method of claim 1, wherein said first insulating layer is silicon oxide deposited by low-pressure chemical vapor deposition and is polished to have a thickness of between about 3000 and 5000 Angstroms over said FET gate electrodes.

8. The method of claim 1, wherein said second polycide layer is composed of a doped polysilicon layer having a thickness of between about 500 and 1000 Angstroms and an upper tungsten silicide layer having a thickness of between about 500 and 1500 Angstroms.

9. The method of claim 1, wherein said second cap layer is silicon nitride deposited by low-pressure chemical vapor deposition to a thickness of between about 1000 and 2000 Angstroms.

10. The method of claim 1, wherein said second sidewall spacers are formed by depositing a conformal layer of silicon oxynitride and anisotropically etching back to form said second sidewall spacers having a width of between about 500 and 1500 Angstroms.

11. The method of claim 1, wherein said capacitor node contact openings that are selectively etched in said first insulating layer to said first contact plugs are also selectively etched to said second cap layer and said second sidewall spacers to prevent electrical shorts to said bit lines.

12. The method of claim 1, wherein said second conducting layer is a doped polysilicon layer deposited by low-pressure chemical vapor deposition to a thickness sufficient to fill the recesses between said bit lines, and is doped with an N type dopant to a concentration of between about $1.0\,E\,20$ and $1.0\,E\,22$ atoms/cm$^3$.

13. The method of claim 1, wherein said second insulating layer is silicon oxide deposited by LPCVD and is planarized to have a thickness of between about 1500 and 4000 Angstroms over said bit lines.

14. A method for making an array of high-density memory cells having auto-self-aligned contacts for DRAM devices on a semiconductor substrate comprising the steps of:

forming device areas for memory cells surrounded and electrically isolated by field oxide areas on said substrate;

forming a gate oxide on said device areas;

depositing a first polycide layer and a first cap oxide layer and patterning to form word lines extending over said device areas to form FET gate electrodes, and forming doped source/drain areas adjacent to said gate electrodes, and forming first sidewall spacers on said word lines;

forming a patterned diffusion protection oxide with openings for contacts to said substrate;

depositing a first conducting layer composed of doped polysilicon;

polishing back said first conducting layer to said first cap oxide layer and patterning said first conducting layer to form first contact plugs that are auto-self-aligned to said gate electrodes;

depositing and planarizing a first insulating layer;

etching bit-line contact openings in said first insulating layer to said first contact plugs;

depositing a second polycide layer and a second cap layer and patterning to form bit lines and forming insulating second sidewall spacers on said bit lines;

etching capacitor node contact openings in said first insulating layer to said first contact plugs;

depositing a second conducting layer composed of doped polysilicon;

polishing back said second conducting layer to said second cap layer and patterning said second conducting layer to form second contact plugs for capacitor node contacts to said first contact plugs, said second contact plugs auto-self-aligned to said bit lines;

depositing and planarizing a second insulating layer and etching openings for capacitor bottom electrodes to said second contact plugs;

forming a third conducting layer in said openings for said capacitor bottom electrodes and forming an interelectrode dielectric layer and a fourth conducting layer to form said capacitors and completing said array of high-density memory cells.

15. The method of claim 14, wherein said first polycide layer is composed of a doped polysilicon layer having a thickness of between about 500 and 2000 Angstroms and an upper tungsten silicide layer having a thickness of between about 500 and 1500 Angstroms.

16. The method of claim 14, wherein said first cap oxide layer is silicon oxide deposited by low-pressure chemical vapor deposition to a thickness of between about 1000 and 2000 Angstroms.

17. The method of claim 14, wherein said first sidewall spacers are silicon oxide and have a width of between about 500 and 1000 Angstroms.

18. The method of claim 14, wherein said diffusion protection layer is silicon oxide deposited by chemical vapor deposition to a thickness of between about 100 and 500 Angstroms.

19. The method of claim 14 wherein said first conducting layer composed of a polysilicon layer is deposited by low-pressure chemical vapor deposition to a thickness sufficient to fill the recesses between said word lines, and is doped with an N type dopant to a concentration of between about $1.0\,E\,20$ and $1.0\,E\,22$ atoms/cm$^3$.

20. The method of claim 14, wherein said first insulating layer is silicon oxide deposited by low-pressure chemical vapor deposition and is polished to have a thickness of between about 2000 and 4000 Angstroms over said FET gate electrodes.

21. The method of claim 14, wherein said second polycide layer is composed of a doped polysilicon layer having a thickness of between about 500 and 1000 Angstroms and an upper tungsten silicide layer having a thickness of between about 500 and 1500 Angstroms.

22. The method of claim 14, wherein said second cap layer is silicon nitride deposited by low-pressure chemical vapor deposition to a thickness of between about 1000 and 2000 Angstroms.

23. The method of claim 14, wherein said second sidewall spacers are formed by depositing a conformal layer of silicon oxynitride and anisotropically etching back to form said second sidewall spacers having a width of between about 500 and 1500 Angstroms.

24. The method of claim 14, wherein said capacitor node contact openings that are selectively etched in said first insulating layer to said first contact plugs are also selectively etched to said second cap layer and said second sidewall spacers to prevent electrical shorts to said bit lines.

25. The method of claim 14, wherein said second conducting layer composed of a doped polysilicon layer is deposited by low-pressure chemical vapor deposition to a thickness sufficient to fill the recesses between said bit lines, and is doped with an N type dopant to a concentration of between about $1.0\,E\,22$ and $1.0\,E\,22$ atoms/cm$^3$.

26. The method of claim 14, wherein said second insulating layer is silicon oxide deposited by LPCVD and is planarized to have a thickness of between about 2000 and 4000 Angstroms over said bit lines.

* * * * *